United States Patent [19]

Ranghelli

[11] 4,327,330

[45] Apr. 27, 1982

[54] HIGH POWER AMPLIFICATION ARRANGEMENT

[75] Inventor: Joseph C. Ranghelli, Brooklyn, N.Y.

[73] Assignee: International Telephone and Telegraph Corporation, New York, N.Y.

[21] Appl. No.: 137,883

[22] Filed: Apr. 7, 1980

[51] Int. Cl.³ .............................. H03F 3/60; H01P 5/12
[52] U.S. Cl. ....................................... 330/56; 330/286; 333/125; 333/137
[58] Field of Search .................. 330/53, 56, 286, 287; 333/125, 137, 109, 113

[56] References Cited

U.S. PATENT DOCUMENTS 2,872,648  2/1959  Gibson ................................ 333/137
3,218,580  11/1965  Zanichkowsky ..................... 333/125

OTHER PUBLICATIONS

Cappucci, Joseph, "Combining Amplifiers?Try Serial-Feed Arrays", Microwaves, Oct. 1976, pp. 36-44.

Primary Examiner—James B. Mullins
Assistant Examiner—Gene Wan
Attorney, Agent, or Firm—John T. O'Halloran; Alfred C. Hill

[57] ABSTRACT

A novel arrangement to achieve high power amplification of a microwave signal by summing the contributions of many small power amplifiers. This arrangement comprises the equivalent of a divider network to distribute an incoming signal to an arbitrary number of small power amplifiers, and a combiner to sum the outputs of all amplifiers into a single output. This arrangement combines the series-fed circuit concept with a dual mode transmission media (a transmission line capable of transmitting two independent orthogonal modes, for example, the circular waveguide $TE_{11}$ mode) for the divider and combiner.

35 Claims, 3 Drawing Figures

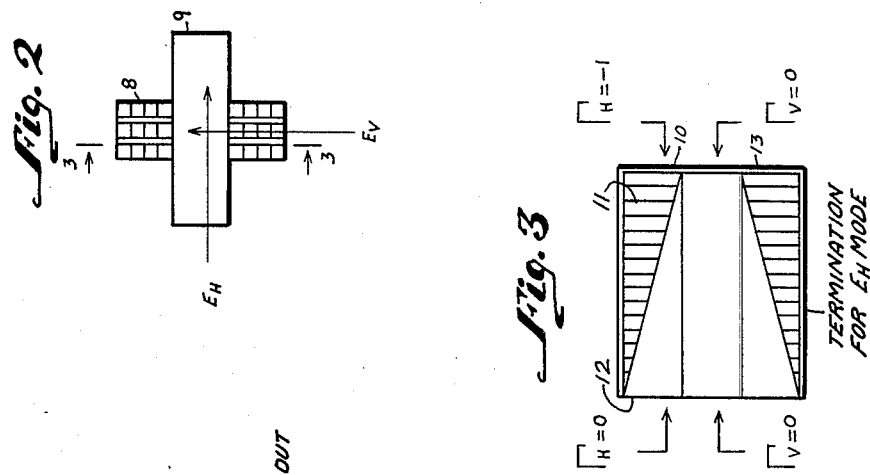

HIGH POWER AMPLIFICATION ARRANGEMENT

BACKGROUND OF THE INVENTION

The present invention relates to power amplification and more particularly to an arrangement to provide high power amplification of a microwave system.

Present day high power amplifiers make use of power combining arrangements. Present day arrangements of power combining and the relative advantages and disadvantages are: (1) parallel, or branching, circuits which employ a number of power splitters or hybrid couplers configured to provide a number of parallel paths emanating from, or converging to, a single port. By employing one branching circuit as a divider and terminating each output with an amplifier and finally recombining the amplified signals with an identical branching circuit, a high power two port amplifier is attained. Advantages include planar realizability, conceptual simplicity, potentially unlimited power addition, and modular. Disadvantages in practice are high loss for large numbers of amplifiers versus size, constructal complexity for high density junction types, interaction effects resulting in high VSWR (voltage standing wave ratio) spikes and/or low isolation spikes, internal dissipation in types using power dividers with ungrounded resistors, unrealizability in series resistor layout for certain planar dividers. (2) Series-fed arrays including a cascade of directional couplers with progressively decreasing coupling coefficients such that equal power results at all output ports (coupled ports). Phase, however, varies in a systematic way from output to output. A two port high power amplifier is attained by terminating each coupled port with identical amplifiers and combining their outputs with an identical type series coupler array reversed end-to-end with respect to the input array. Advantages include potentially unlimited power combining, all internal terminations are grounded, simple design equations for coupling array, easily incremented in power. Disadvantages include power loss due to coupling variations resulting from tolerance and frequency law of coupling, for large numbers of amplifiers the coupling coefficients become very small and difficult to control in construction and variations of coupling characteristics (flatness, VSWR, phase and directivity) with coupling coefficient. (3) Multi-element combining employs an array of amplifier elements around the perimeter or cross-section of a transmission line. Advantages could include compactness, and low loss. Disadvantages include physical limit on the number of elements that can be packaged on a transmission line perimeter, low or undesirable impedance level seen by active elements and higher mode spurious responses.

SUMMARY OF THE INVENTION

An object of the present invention is to provide an improved high power amplification system for a microwave signal retaining the advantages of the prior art and substantially reducing the disadvantages thereof.

Another object of the present invention is to provide a high power amplification of microwave signals which combine the series-fed power combining circuit concept with a dual mode transmission media (a transmission line capable of transmitting two independent or orthogonal modes, for example, the circular waveguide $TE_{11}$ mode).

A feature of the present invention is the provision of an arrangement to provide high power amplification of a microwave signal comprising a plurality of low power amplifiers; a first means capable of propagating therein two independent orthogonal modes coupled to the plurality of amplifiers and the microwave signal to distribute the microwave signal at an input end thereof equally to each of the plurality of amplifiers; and a second means capable of propagating therein two independent orthogonal modes coupled to the plurality amplifiers to sum the output signals of each of the plurality of amplifiers to provide at the output of the second means the microwave signal with the high power amplification.

The high power amplification arrangement of the present invention provides the following advancements in the art: (1) Unlimited incrementing of power without a progressive loss of efficiency due to tolerances, coupling coefficient variation, or extra circuitry generated by branching requirements. (2) Coupling by summation of orthogonal modes provides a simple means to vary coupling which is independent of power level, no coupling effects on VSWR and flatness, and provides the highest isolation of any arrangement of coupling. Also, tolerance problems are reduced to standard machine tolerances without material or alignment problems. "Odd" and "even" mode impedances are independent of coupling level. (3) Spurious modes and error powers are dissipated by "grounded" terminations which are capable of being well heat sunk.

BRIEF DESCRIPTION OF THE DRAWING

Above mentioned and other features and objects of this invention will become more apparent by reference to the following description taken in conjunction with the accompanying drawing, in which:

FIG. 1 is a diagrammatic illustration of a high power amplification arrangement for microwave signals in accordance with the principles of the present invention;

FIG. 2 is an end view of one of the mode filters employed in FIG. 1; and

FIG. 3 is a view taken along line 3—3 of FIG. 2.

DESCRIPTION OF THE PREFERRED EMBODIMENT

Referring to FIG. 1, there is illustrated therein diagrammatically one practical embodiment of the high power amplification arrangement of the present invention. The arrangement includes a power divider in the form of a circular waveguide 1 which develops equal amplitude output signals at all coupled ports in the form of coaxial probes 2 with a progressive and systematic phase change. After identical amplification of each divider output in amplifiers 3, the amplifier output signals are combined in a combiner in the form of circular waveguide 4 which is configured to provide complementary phase changes with respect to the phase changes of divider 1 such that all paths between the input of divider 1 and the output of combiner 4 are equal in phase. The phase integrity is further enhanced by use of identical probes 2 and 5 and identical mode filters 6 and 7, both as to construction and number per path traversed between the input of divider 1 and the output of combiner 4. The phase integrity is also enhanced by a coupling technique which is identical everywhere regardless of the coupling factor.

This coupling technique is described as follows. Directional coupling is obtained by spatial reduction of an incident vector into quadrature components and totally extracting one component. The coupling coefficient is completely determined by the spatial angle, i.e., since $\alpha = k$. or since $\beta = k$. The circuit components which act as a directional coupler are: coaxial probes 2 which are designed to couple 100% of power in alignment with its center line, the coaxial probe orientation angle ($\alpha_i$ or $\beta_i$) which sets the coupling coefficient, and the adjacent pair of mode filters 6 or 7, the rear one of which acts as the coaxial probe back cavity short circuit termination for unidirectional power flow and the forward filter transmits the desired forward wave (orthogonal to the coupled wave at the probes 2 and 5) and absorbs the leakage (directivity) power in a termination. The mode filters 6 and 7 are also characterized by orientation angles ($\alpha_i$ or $\beta_i$) necessary to obtain efficient alignment with the coupled and forward wave vectors. Although the above describes a divider, a combiner is obtained with the same circuit by reciprocal action.

As illustrated in FIGS. 2 and 3, the mode filters 6 and 7 include orthogonal quasi-rectangular waveguides 8 and 9 with waveguide 9 passing an incident vector with very low loss and waveguide 8 oriented orthogonally to waveguide 9. Waveguide 8 includes a tapered termination 11 where all orthogonal modes of the TE type incident at the tapered end 10 of tapered termination 11 are dissipated with low reflection. Waves incident at the end 12 of termination 11 are reflected from a short circuit plate 13 terminating the tapered (conical) termination 11 for orthogonally oriented waves. The plate 13 terminating the termination 11 are attached to the outside walls of the waveguide and can dissipate large amounts of power by heat sinking techniques. In addition to TE modes, circularly polarized modes which can arise in the circular waveguides due to phase errors will be reduced to TE modes by the action of termination 11 and the shorting plate 13.

The action of progressively adding equal orthogonal vector increments to a travelling wave in a dual mode waveguide will produce a rotating power vector. Increments introduced by the same rule (clockwise or counterclockwise) throughout result in a power vector rotation of 360° which requires a similar range in the alignment angles $\alpha$ and $\beta$. Other rules allow a restriction to 90° rotation which after ten increments is reduced to 5° or less.

Other forms of the present invention can have the following variations. (1) In place of the circular waveguide, other forms of dual mode guides can be used, such as square waveguides, ridged waveguides, four-wire transmission line arrangements, etc. (2) Coupling in place of a coax probe can be achieved with rectangular waveguides, irises, coax-waveguides, etc. (3) Mode filtering can be achieved with rods, plates and irises and terminations can be coaxially coupled, film card inserts, etc. (4) Alignment angles can be made fixed in orientation by employing polarization rotation techniques, such as stepped angle plates, rods, plates or probe irises, etc. (5) Amplifiers of different power gain can be accommodated by adjustment of coupling level, i.e. coupling guide alignment angles $\alpha_i$ and $\beta_i$.

While I have described above the principles of my invention in connection with specific apparatus it is to be clearly understood that this description is made only by way of example and not as a limitation to the scope of my invention as set forth in the objects thereof and in the accompanying claims.

I claim:

1. An arrangement to provide high power amplification of a microwave signal comprising:
   a plurality of amplifiers;
   a first means capable of propagating therein two independent orthogonal modes, said first means including a power divider capable of propagating therein two independent orthogonal modes having an input receiving said microwave signal and a plurality of output ports each coupled to a different one of said plurality of amplifiers, said power divider providing equal amplitude output signals at each of said plurality of output ports with a predetermined progressive and systematic phase change between adjacent ones thereof, said power divider including a circular waveguide and each of said plurality of output ports including a coaxial probe having a predetermined angular orientation with respect to a reference angle;
   a plurality of mode filters each disposed within said circular waveguide between different adjacent ones of said plurality of coaxial probes and having a given angular orientation with respect to said reference angle; and
   a second means capable of propagating therein two independent orthogonal modes, said second means coupled to said plurality of amplifiers to sum the output signals of each of said plurality of amplifiers to provide at the output of said second means said microwave signal with said high power amplification.

2. An arrangement according to claim 1, wherein each of said plurality of mode filters includes
   a first quasi-rectangular waveguide to pass one of said two orthogonal modes with very little loss, and
   a second quasi-rectangular waveguide disposed in an orthogonal relationship with said first waveguide to dissipate with low reflection the other of said two orthogonal modes.

3. An arrangement according to claim 2, wherein said second waveguide includes
   a tapered termination for said other of said two orthogonal modes, and
   a short circuit plate connected to said tapered termination at the walls of said second waveguide for power dissipation.

4. An arrangement according to claim 3, wherein the end of said circular waveguide remote from said input is provided with a predetermined termination for unidirectional power flow.

5. An arrangement according to claim 4, wherein said predetermined termination includes a short circuit.

6. An arrangement to provide high power amplification of a microwave signal comprising:
   a plurality of amplifiers;
   a first means capable of propagating therein two independent orthogonal modes, said first means including a power divider capable of propagating said two independent orthogonal modes having an input receiving said microwave signal and a plurality of output ports each coupled to a different one of said plurality of amplifiers, said power divider providing equal output signals at each of said plurality of output ports with a predetermined progressive and systematic phase change between adjacent ones thereof;

a plurality of mode filters each disposed between different adjacent ones of said plurality of output ports and having a given angular orientation with respect to a reference angle; and a second means capable of propagating therein said two independent orthogonal modes, said second means coupled to said plurality of ampifiers to sum the output signals of each of said plurality of amplifiers to provide at the output of said second means said microwave signal with said high power amplification.

7. An arrangement according to claim 6, wherein each of said plurality of mode filters includes a first quasi-rectangular waveguide to pass one of said two orthogonal modes with very little loss, and a second quasi-rectangular waveguide disposed in an orthogonal relationship with said first waveguide to dissipate with low reflection the other of said two orthogonal modes.

8. An arrangement according to claim 7, wherein said second waveguide includes a tapered termination for said other of said two orthogonal modes, and a short circuit plate connected to said tapered termination at the walls of said second waveguide for power dissipation.

9. An arrangement to provide high power amplification of a microwave signal comprising:

a plurality of amplifiers;

a first means capable of propagating therein two independent orthogonal modes, said first means includes a power divider having an input receiving said microwave signal and a plurality of output ports each coupled to a different one of said plurality of amplifiers, said power divider providing equal output signals at each of said plurality of output ports with a first predetermined progressive and systematic phase change between adjacent ones thereof; and a second means capable of propagating therein two independent orthogonal modes, said second means including a power combiner capable of propagating therein two independent orthogonal modes having a plurality of input ports each coupled to a different one of said plurality of amplifiers and an output, said power combiner summing the output signals of each of said plurality of amplifiers to provide at said output thereof said microwave signal with said high power amplification, each of said plurality of input ports having a second predetermined progressive and systematic phase change between adjacent ones thereof to provide complementing phase changes with respect to said first predetermined phase changes so that all paths between said input of said power divider and said output of said power combiner are equal in phase.

10. An arrangement according to claim 9, wherein said power combiner includes a first circular waveguide.

11. An arrangement according to claim 10, wherein each of said plurality of input ports includes a first coaxial probe having a predetermined angular orientation with respect to a first reference angle.

12. An arrangement according to claim 11, further including a first plurality of mode filters each disposed within said first circular waveguide between different adjacent ones of said plurality of first coaxial probes and having a given angular orientation with respect to said first reference angle.

13. An arrangement according to claim 12, wherein each of said first plurality of mode filters includes a first quasi-rectangular waveguide to pass one of said two orthogonal modes with very little loss, and a second quasi-rectangular waveguide disposed in an orthogonal relationship with said first waveguide to dissipate with low reflection the other of said two orthogonal modes.

14. An arrangement according to claim 13, wherein said second waveguide includes a first tapered termination for said other of said two orthogonal modes, and a first short circuit plate connected to siad first tapered termination at the walls of said second waveguide for power dissipation.

15. An arrangement according to claim 14, wherein the end of said first circular waveguide remote from said output is provided with a predetermined termination for unidirectional power flow.

16. An arrangement according to claim 15, wherein said predetermined termination includes a short circuit.

17. An arrangement according to claim 9, further including a first plurality of mode filters each disposed between different adjacent ones of said plurality of input ports and having a given angular orientation with respect to a first reference angle.

18. An arrangement according to claim 17, wherein each of said first plurality of mode filters includes a first quasi-rectangular waveguide to pass one of said two orthogonal modes with very little loss, and a second quasi-rectangular waveguide disposed in an orthogonal relationship with said first waveguide to dissipate with low reflection the other of said two orthogonal modes.

19. An arrangement according to claim 18, wherein said second waveguide includes a first tapered termination for said other of said two orthogonal modes, and a first short circuit plate connected to said first tapered termination at the walls of said second waveguide for power dissipation.

20. An arrangement to provide high power amplification of a microwave signal comprising:

a plurality of amplifiers, a first means capable of propagating therein two independent orthogonal modes, said first means receiving said microwave signal and coupled to said plurality of amplifiers to distribute said microwave signal equally to each of said plurality of amplifiers;

a second means capable of propagating therein two independent orthogonal modes, said second means including a power combiner capable of propagating therein two independent orthogonal modes having a plurality of input ports each coupled to a different one of said plurality of amplifiers and an output, said power combiner summing the output signals of each of said plurality of amplifiers to provide at said output thereof said microwave signal with said high power amplification, each of said plurality of input ports having a predetermined progressive and systematic phase change between adjacent ones thereof, said power combiner including a circular waveguide and each of said plurality of input ports including a coaxial probe having a predetermined angular orientation with respect to a reference angle; and a plurality of mode filters each disposed within said circular waveguide between different adjacent ones of said plurality of coaxial probes and having a given angular orientation with respect to said reference angle.

21. An arrangement according to claim 20, wherein each of said plurality of mode filters includes
   a first quasi-rectangular waveguide to pass one of said two orthogonal modes with very little loss, and
   a second quasi-rectangular waveguide disposed in an orthogonal relationship with said first waveguide to dissipate with low reflection the other of said two orthogonal modes.

22. An arrangement according to claim 21, wherein said second waveguide includes
   a tapered termination for said other of said two orthogonal modes, and
   a short circuit plate connected to said tapered termination at the walls of said second waveguide for power dissipation.

23. An arrangement to provide high power amplification of a microwave signal comprising:
   a plurality of amplifiers;
   a first means capable of propagating therein two independent orthogonal modes, said first means receiving said microwave signal and coupled to said plurality of amplifiers to distribute said microwave signal equally to each of said plurality of amplifiers;
   a second means capable of propagating therein two independent orthogonal modes, said second means including a power combiner capable of propagating therein two independent orthogonal modes having a plurality of input ports each coupled to a different one of said plurality of amplifiers and an output, said power combiner summing the output signals of each of said plurality of amplifiers to provide at said output thereof said microwave signal with said high power amplification, each of said plurality of input ports having a predetermined progressive and systematic phase change between adjacent ones thereof; and
   a plurality of mode filters each disposed between different adjacent ones of said plurality of input ports and having a given angular orientation with respect to a reference angle.

24. An arrangement according to claim 23, wherein each of said plurality of mode filters includes
   a first quasi-rectangular waveguide to pass one of said two orthogonal modes with very little loss, and
   a second quasi-rectangular waveguide disposed in an orthogonal relationship with said first waveguide to dissipate with low reflection the other of said two orthogonal modes.

25. An arrangement according to claim 24, wherein said second waveguide includes
   a tapered termination for said other of said two orthogonal modes, and a short circuit plate connected to said tapered termination at the walls of said second waveguide for power dissipation.

26. An arrangememt according to claim 16, wherein said power divider includes
   a second circular waveguide.

27. An arrangement according to claim 26, wherein each of said plurality of output ports includes
   a second coaxial probe having a predetermined angular orientation with respect to a second reference angle.

28. An arrangement according to claim 27, further including
   a second plurality of mode filters each disposed within said second circular waveguide between different adjacent ones of said plurality of second coaxial probes and having a given angular orientation with respect to said second reference angle.

29. An arrangement according to claim 28, wherein each of said second plurality of mode filters includes
   a third quasi-rectangular waveguide to pass one of said two orthogonal modes with very little loss, and
   a fourth quasi-rectangular waveguide disposed in an orthogonal relationship with said third waveguide to dissipate with low reflection the other of said two orthogonal modes.

30. An arrangement according to claim 29, wherein said fourth waveguide includes
   a second tapered termination for said other of said two orthogonal modes, and
   a second short circuit plate connected to said second tapered termination at the walls of said fourth waveguide for power dissipation.

31. An arrangement according to claim 30, wherein the end of said second circular waveguide remote from said input is provided with a predetermined termination for unidirection power flow.

32. An arrangement according to claim 31, wherein said predetermined termination includes a short circuit.

33. An arrangement according to claim 19, further including
   a second plurality of mode filters each disposed between different adjacent ones of said plurality of input ports and having a given angular orientation with respect to a second reference angle.

34. An arrangement according to claim 33, wherein each of said second plurality of mode filters includes
   a third quasi-rectangular waveguide to pass one of said two orthogonal modes with very little loss, and
   a fourth quasi-rectangular waveguide disposed in an orthogonal relationship with said third waveguide to dissipate with low reflection the other of said two orthogonal modes.

35. An arrangement according to claim 34, wherein said fourth waveguide includes
   a second tapered termination for said other of said two orthogonal modes, and
   a second short circuit plate connected to said second tapered termination at the walls of said fourth waveguide for power dissipation.

* * * * *